(12) United States Patent
Endo et al.

(10) Patent No.: US 10,483,958 B2
(45) Date of Patent: Nov. 19, 2019

(54) VOLTAGE DETECTOR AND METHOD FOR DETECTING VOLTAGE

(71) Applicant: Cypress Semiconductor Corporation, San Jose, CA (US)

(72) Inventors: Yoshiyuki Endo, Kawasaki-Ku (JP); Kazuhiro Kamiya, Kawasaki-Ku (JP)

(73) Assignee: Cypress Semiconductor Corporation, San Jose, CA (US)

( * ) Notice: Subject to any disclaimer, the term of this patent is extended or adjusted under 35 U.S.C. 154(b) by 736 days.

(21) Appl. No.: 14/635,459

(22) Filed: Mar. 2, 2015

(65) Prior Publication Data

US 2016/0261259 A1 Sep. 8, 2016

(51) Int. Cl.
*H03K 5/24* (2006.01)
*G01R 19/165* (2006.01)

(52) U.S. Cl.
CPC ..... *H03K 5/2472* (2013.01); *G01R 19/16576* (2013.01)

(58) Field of Classification Search
CPC ........ G01R 19/16566; G01R 19/16576; G01R 19/1659; G01R 19/16595; G01R 19/165; H03K 5/2472
See application file for complete search history.

(56) References Cited

U.S. PATENT DOCUMENTS

| | | | | |
|---|---|---|---|---|
| 9,209,790 | B1* | 12/2015 | Wadhwa | H03K 5/2472 |
| 2004/0108949 | A1* | 6/2004 | Jansson | H03M 1/1061 |
| | | | | 341/156 |
| 2012/0025805 | A1* | 2/2012 | Matsushita | G01R 19/16542 |
| | | | | 324/76.11 |
| 2012/0076246 | A1* | 3/2012 | Okada | H03G 3/3068 |
| | | | | 375/340 |
| 2013/0027089 | A1* | 1/2013 | Huang | G01R 19/16552 |
| | | | | 327/87 |
| 2014/0016239 | A1* | 1/2014 | Kim | H02H 11/007 |
| | | | | 361/92 |

* cited by examiner

*Primary Examiner* — Son T Le
*Assistant Examiner* — Dustin R Dickinson

(57) ABSTRACT

A voltage detector includes a comparison unit which is equipped with a plurality of comparators and which is configured to compare a threshold voltage and determination voltages corresponding to each comparator and output a first result of High or Low for each comparator and configured to compare an input voltage and the determination voltages and output a second result of High or Low for each comparator, and a determination unit configured to determine based on the first result and the second result whether or not the input voltage is less than or equal to the threshold voltage.

8 Claims, 16 Drawing Sheets

FIG. 17

| Circuit A | | × |
|---|---|---|
| 13 | | 41 |
| (X,Y)=(100um,212.5um) | | (X,Y)=(50um,47.4um) |
| 21250 | | 2370 |

VOLTAGE DETECTOR AND METHOD FOR DETECTING VOLTAGE

BACKGROUND

As a low voltage detector, there has recently been known one comprised of a BGR (Band Gap Reference) circuit, a circuit which divides an input voltage, and a comparator (for example, JP2011-198093 and JP2009-277122).

In the related art low voltage detector, however, a circuit scale (such as area or complexity) thereof increases because it is a circuit independent on a semiconductor process variation and temperature, and further a detectable voltage value has been fixed.

SUMMARY

Several aspects of the present invention are to provide, as one object, a voltage detector and a method for detecting a voltage, which are capable of reducing a circuit scale and making a detectable voltage value variable.

A voltage detector in one aspect of the present invention includes a comparison unit which has a plurality of comparators each including MOSFETs and is provided with a comparison unit configured to compare a threshold voltage and determination voltages corresponding to each comparator and output a first result of High or Low for each comparator, and configured to compare an input voltage and the determination voltages and output a second result of High or Low for each comparator, and a determination unit configured to determine based on the first result and the second result whether or not the input voltage is less than or equal to the threshold voltage.

A voltage detecting method in one aspect of the present invention is a method for detecting a voltage in a voltage detector, and includes the steps of by a comparison unit provided with a plurality of comparators each having MOSFETs, comparing a threshold voltage and determination voltages corresponding to each of the comparators and outputting a first result of High or Low for each comparator, by the comparison unit, comparing an input voltage and the determination voltages and outputting a second result of High or Low for each comparator, and determining, by a determination unit, based on the first result and the second result whether the input voltage is less than or equal to the threshold voltage.

In the embodiments presented herein, the terms "part", "device" and "system" not only mean physical mechanisms, but also include realization of functions that the "part", "device" and "system" have, by software. The function that one "part", "device" or "system" has may be realized by two or more physical mechanisms or devices. Alternatively, the two or more functions of "part", "device" and "system" may be realized by one physical mechanism or device.

BRIEF DESCRIPTION OF THE DRAWINGS

The accompanying drawings are incorporated herein and form a part of the specification.

FIGS. 4A, 4B and 4C are respectively diagrams for describing a transistor size of each comparator in the configuration a;

FIG. 17 is a diagram for describing the ratio between the areas of the voltage detectors in the related art and an embodiment.

In the drawings, like reference numbers generally indicate identical or similar elements.

DETAILED DESCRIPTION

Embodiments

Figure 1:
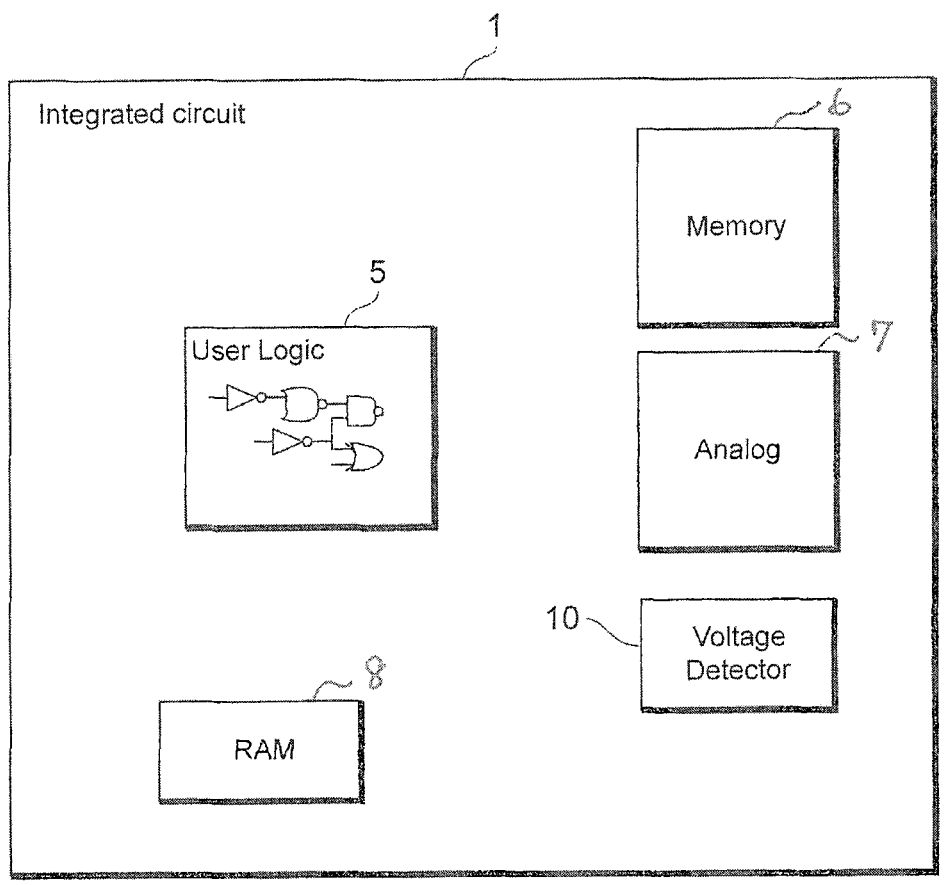
FIG. 1 is a block diagram illustrating one example of an integrated circuit in an embodiment.

FIGS. 1 through 18 are respectively diagrams for describing an embodiment of an integrated circuit. FIG. 1 is a block diagram illustrating one example of the integrated circuit 1 in an embodiment. The integrated circuit 1 includes a user logic unit 5, a voltage detector 10, a memory 6, a RAM (Random Access Memory) 8, and an analog unit 7.

The user logic unit 5 includes various functions designed by a user. The user logic unit 5 is comprised of MOSFETs (Metal Oxide Semiconductor Field Effect Transistors).

The voltage detector 10 is a circuit capable of detecting that an input voltage is less than or equal to or greater than or equal to a threshold voltage. The voltage detector 10 can be applied to a low voltage detection circuit, a reset detection circuit, a transistor characteristic determination circuit or a regulator circuit with a low voltage detecting function, or the like. The present voltage detector 10 will hereinafter be described in detail.

Voltage Detector

Figure 2:
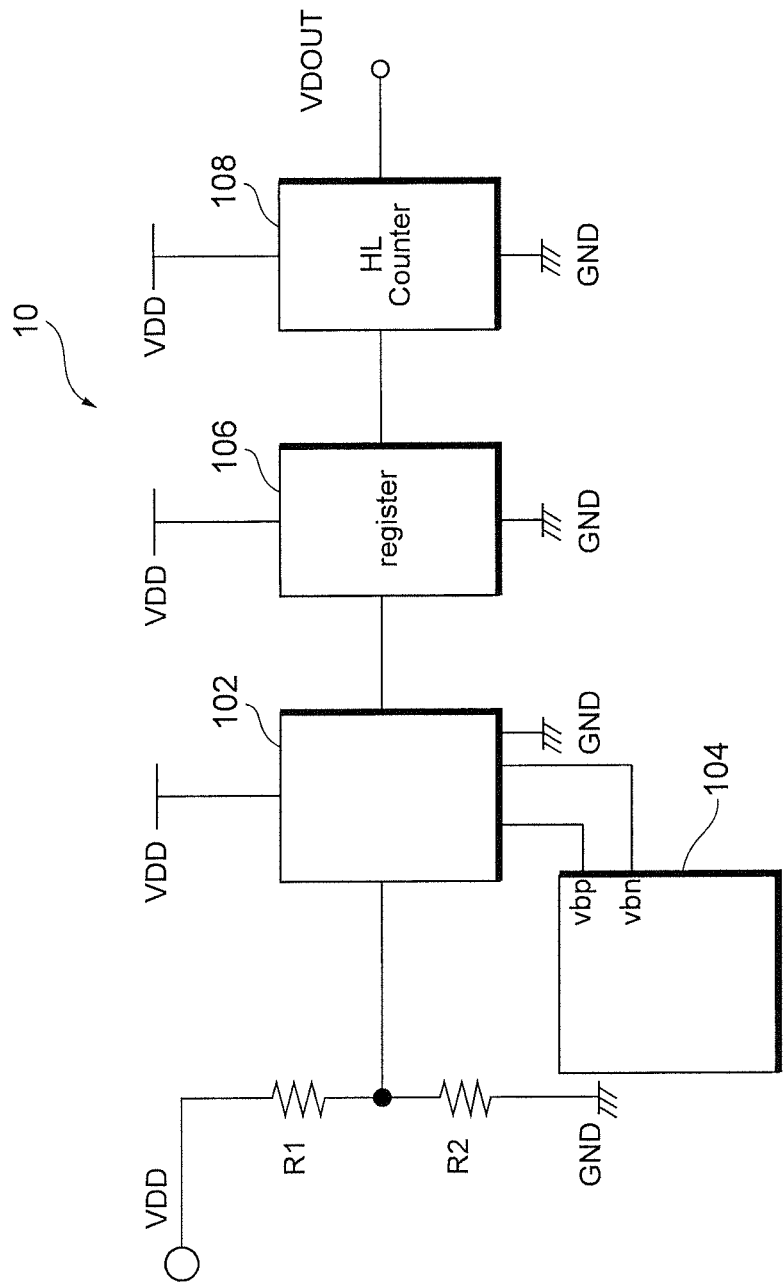
FIG. 2 is a block diagram illustrating one example of a voltage detector in an embodiment.

FIG. 2 is a block diagram illustrating one example of the voltage detector 10 in an embodiment. The voltage detector 10 illustrated in FIG. 2 includes voltage dividing resistors R1 and R2, a variable comparator 102, a determination voltage generating circuit 104, a register 106 and an HL counter 108.

In the voltage detector 10, for example, a power supply part (not shown) is connected to one terminal of the resistor R1. The other terminal of the resistor R1 and one terminal of the resistor R2 are connected to each other, and the other terminal of the resistor R2 is connected to a ground GND. The voltage detector 10 compares an input voltage and a threshold voltage. The threshold voltage described herein is assumed to be, for example, a fixed voltage applied to a VDD terminal from a tester, but it is assumed that its application source or method does not matter in the sense that the fixed voltage is applied thereto. Further, the input voltage described herein is a voltage targeted for monitoring in the present invention.

The voltage divided by the resistors is inputted to the variable comparator 102. The variable comparator 102 has a plurality of comparators. Each of the comparators is configured using MOSFETs. Thus, it is possible to reflect the characteristics of MOSFETs in the user logic unit 5 on the result of comparison by each comparator.

The variable comparator 102 inputs therein determination set voltages vbp and vbn generated by the determination voltage generating circuit 104, compares each determination voltage determined according to the determination set voltages and the divided voltage, and outputs a signal of an H (High) level or an L (Low) level as a comparison result for each comparator.

For example, the variable comparator 102 compares the threshold voltage and the determination voltages corresponding to each comparator and outputs a first result indicative of either High (H) or Low (L) for each comparator. Further, the variable comparator 102 compares the input voltage and each determination voltage corresponding to each comparator and outputs a second result indicative of High (H) or Low (L) for each comparator. Here, the threshold voltage and the input voltage are referred to as the threshold voltage and the input voltage even when they are divided. The variable comparator 102 is a comparison unit which compares the threshold voltage or the input voltage and the determination voltages.

The determination voltage generating circuit 104 generates the determination set voltages vbp and vbn for determining the determination voltage for performing comparison determination as to the divided voltage and inputs the same to the variable comparator 102.

The register 106 stores therein a second result of each comparator outputted from the variable comparator 102. For example, the register 106 stores whether the second result of each comparator is at the H or L level. The voltage detector 10 is capable of controlling determination timing of the voltage by provision of the register 106. For example, the voltage detector 10 is capable of regularly performing determination processing. Incidentally, the register 106 is not necessarily an essential configuration. The second result of each comparator may be inputted directly to the HL counter 108.

The HL counter 108 holds the first result when the threshold voltage is inputted to the variable comparator 102 and determines based on the held first result and the second result when the input voltage is inputted to the variable comparator 102 whether the input voltage is less than or equal to the threshold voltage. The HL counter 108 is also a determination unit which determines whether the input voltage is less than or equal to the threshold voltage.

For example, when the threshold voltage is inputted in advance, the HL counter 108 stores the number of H levels therein with respect to the first result of each comparator included in the variable comparator 102. This number is also referred to as H1.

Next, when the input voltage targeted for the determination is inputted from the power supply part, the HL counter 108 counts the number of H levels with respect to the second result of each comparator included in the variable comparator 102. This number is also referred to as H2. The HL counter 108 compares H1 at the threshold voltage and H2 at the input voltage to thereby determine whether the input voltage is less than or equal to the threshold voltage. Incidentally, the HL counter 108 can be implemented with a count of the number of H by a CPU (Central Processing Unit) of a microcomputer, for example.

As will be described later using FIG. 12, for example, H2 corresponding to the second result of each comparator increases when the input voltage becomes low, whereas when H2 exceeds H1, the HL counter 108 determines that the input voltage is less than or equal to the threshold voltage.

The HL counter 108 outputs the result of determination as VDOUT. For example, the HL counter 108 outputs a signal of an L level if the input voltage is less than or equal to the threshold voltage, and outputs a signal of an H level if the input voltage is larger than the threshold voltage. At this time, the signal of the L level may be associated with a reset signal. Thus, the voltage detector 10 is capable of outputting the reset signal when the input voltage becomes less than or equal to the threshold voltage.

A description will next be made about the configurations of the variable comparator 102 and the determination voltage generating circuit 104. The notation of VDD and GND will be omitted in FIG. 3 and subsequently.

Configuration a of Variable Comparator

Figure 3:
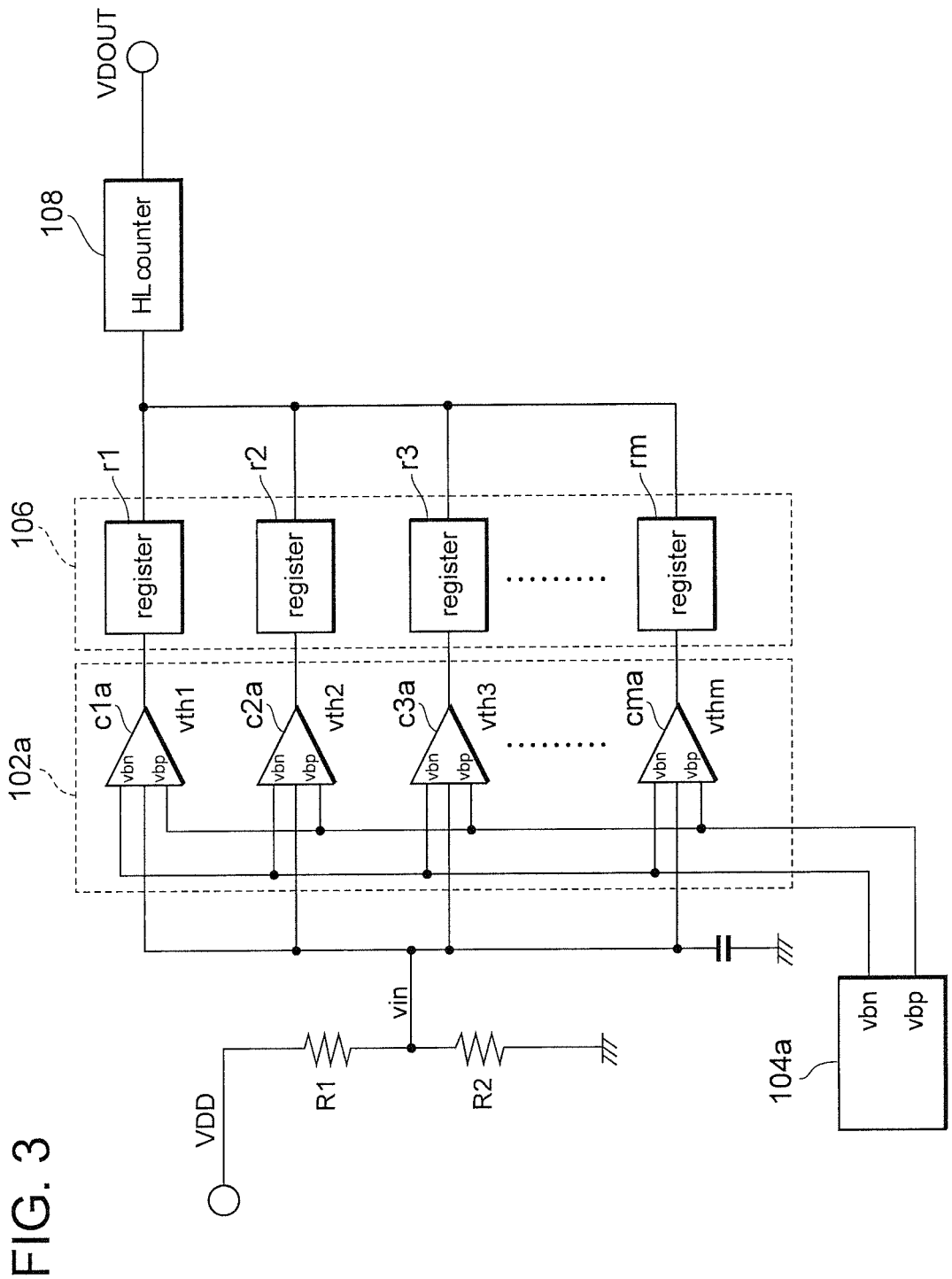
FIG. 3 is a block diagram illustrating one example of a configuration a of a variable comparator in an embodiment.

FIG. 3 is a block diagram illustrating one example of a configuration a of a variable comparator in an embodiment. The variable comparator 102a illustrated in FIG. 3 includes comparators c1a, c2a, . . . , cma. Each comparator has determination thresholds vth1, vth2, vth3, . . . , vthm respectively different from each other.

Each of the comparators inputs therein determination set voltages vbp and vbn from a determination voltage generating circuit 104a and a voltage yin obtained by dividing an input voltage, and outputs a signal of an H level or an L level in accordance with its determination threshold. The determination threshold of each comparator is determined depending on the combination of the determination set voltages vbp and vbn as illustrated in FIG. 12 to be described later.

At this time, a register 106 has registers r1, r2, r3, . . . , rm corresponding to the comparators. Each register stores a second result (H: High or L: Low) of the corresponding comparator therein. The second result stored in each register is inputted to an HL counter 108.

In the example illustrated in FIG. 3, the determination set voltages vbp and vbn of the variable comparator 102a are common to the respective comparators. Further, since the transistor sizes of the comparators are respectively different from each other, the determination threshold voltages of the comparators are respectively different from each other.

Figure 4A:
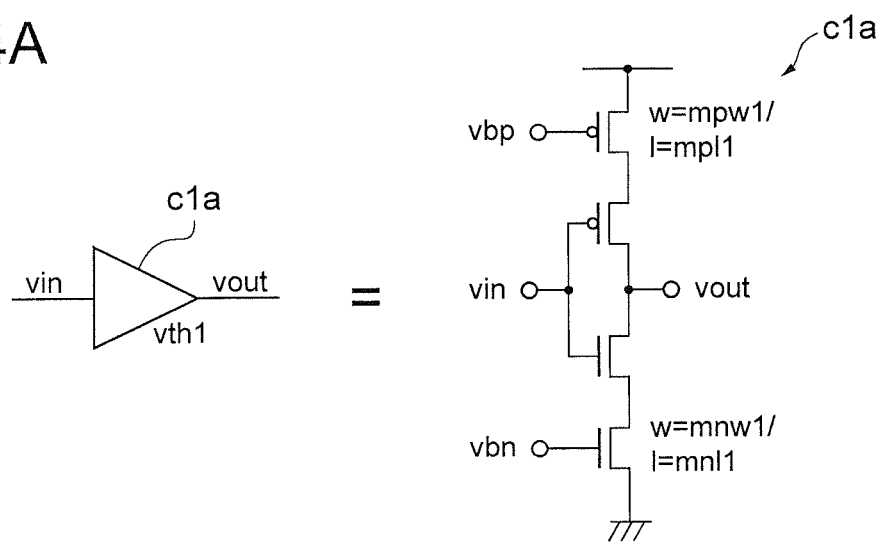

FIG. 4 is a diagram for describing the transistor size of each comparator in the configuration a. The example illustrated in FIG. 4 is only one example. A configuration may be adopted in which vbp and vbn are arranged in reverse. FIG. 4A is a diagram illustrating each transistor size in the comparator c1a. A gate width w of a transistor on the side of the determination set voltage vbp, which is included in the comparator c1a, is mpw1, and a gate length l thereof is mpl1. Further, a gate width w of a transistor on the determination set voltage vbn side is mnw1, and a gate length l thereof is mnl1.

Figure 4B:
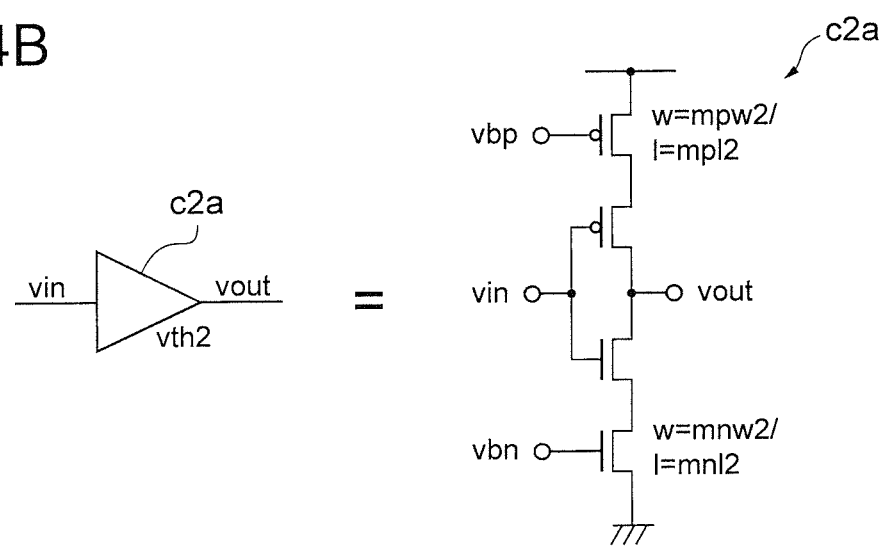

FIG. 4B is a diagram illustrating each transistor size in the comparator c2a. A gate width w of a transistor on the side of the determination set voltage vbp, which is included in the comparator c2a, is mpw2, and a gate length l thereof is mpl2. Further, a gate width w of a transistor on the determination set voltage vbn side is mnw2, and a gate length l thereof is mnl2.

Figure 4C:
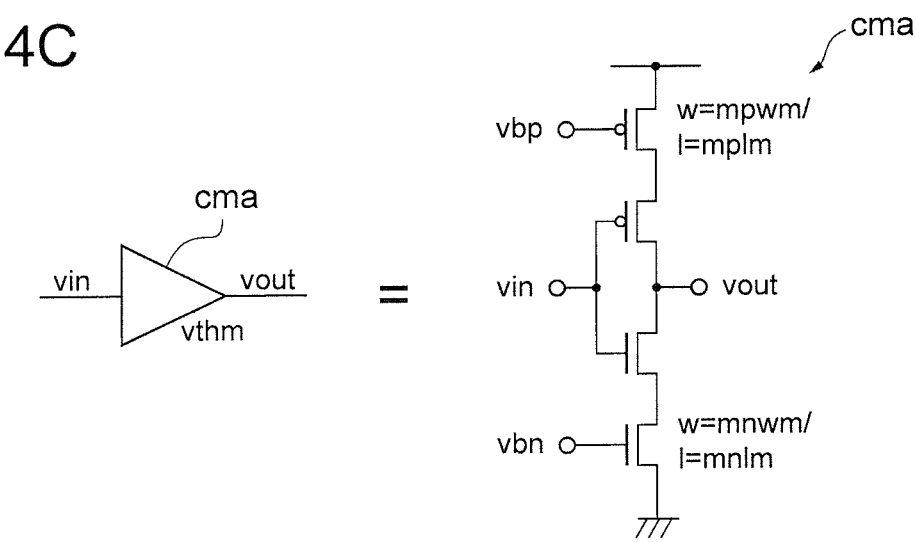

FIG. 4C is a diagram illustrating each transistor size in the comparator cma. A gate width w of a transistor on the side of the determination set voltage vbp, which is included in the comparator cma, is mpwm, and a gate length l thereof is mplm. Further, a gate width w of a transistor on the determination set voltage vbn side is mnwm, and a gate length l thereof is mnlm.

Incidentally, in order to make the determination thresholds vth1, vth2, vthm different from each other, the gate width w and/or gate length l are adjusted in such a manner that the transistor sizes of the respective comparators respectively become different from each other.

Configuration Aa of Determination Voltage Generating Circuit

Figure 5:
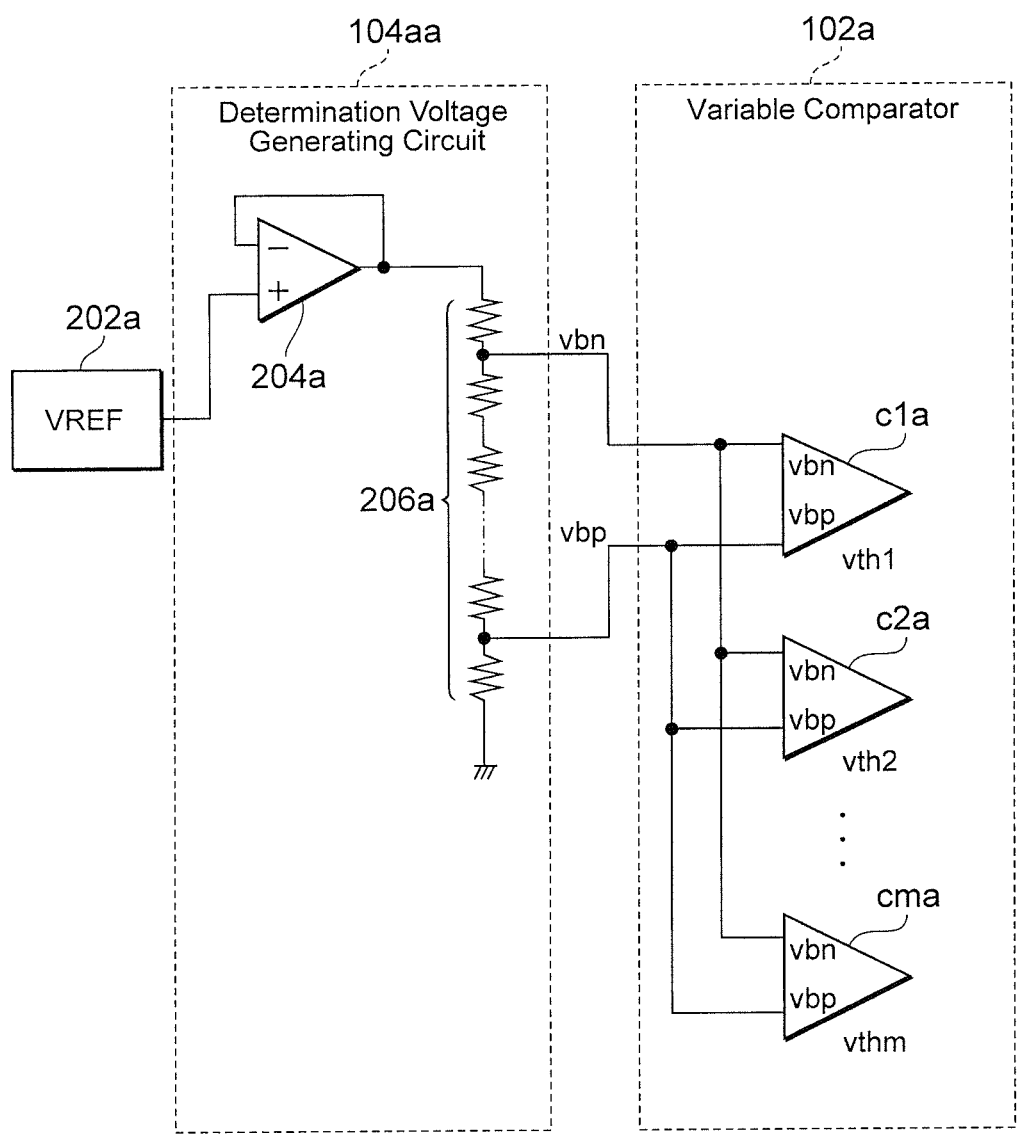
FIG. 5 is a block diagram illustrating one example of a determination voltage generating circuit 104*aa*.

A description will next be made about a configuration example for generating determination set voltages Vbp and vbn corresponding to the configuration a. FIG. 5 is a block diagram illustrating one example of a determination voltage generating circuit 104aa. The determination voltage generating circuit 104aa illustrated in FIG. 5 has a buffer 204a inputted with a reference voltage from a reference power supply source VREF202a provided in the integrated circuit 1, and a resistor group 206a for dividing the reference voltage to generate the determination set voltages vbp and vbn. As illustrated in FIG. 5, the determination set voltages vbp and vbn generated by the determination voltage generating circuit 104aa are respectively inputted to the comparators c1a, c2a, cma.

Configuration ab of Determination Voltage Generating Circuit

Figure 6:
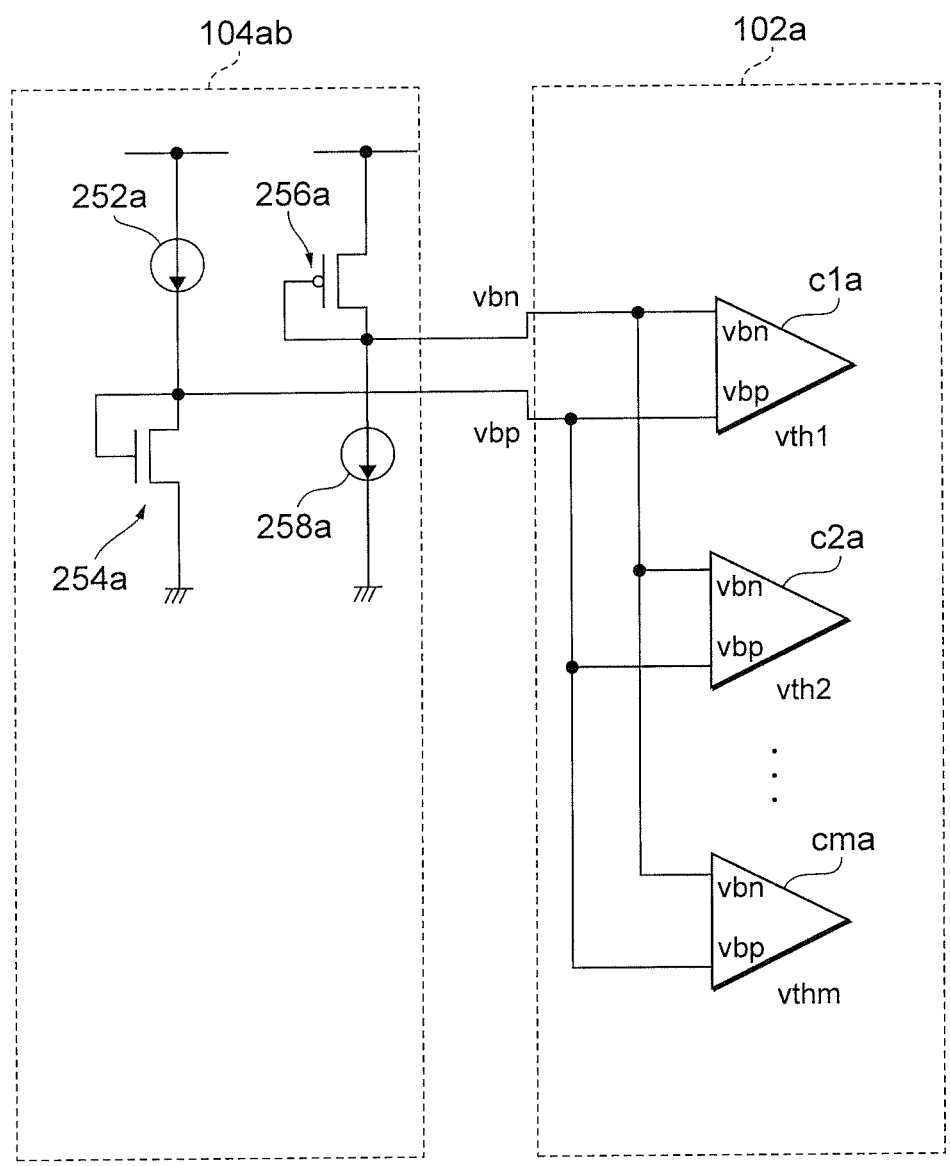
FIG. 6 is a block diagram illustrating one example of a determination voltage generating circuit 104*ab*.

FIG. 6 is a block diagram illustrating one example of a determination voltage generating circuit 104ab. Using a transistor 254a connected to a constant current source 252a, and a constant current source 258a connected to a transistor 256a, the determination voltage generating circuit 104ab illustrated in FIG. 6 allows constant currents to flow through the diode-connected transistors 254a and 256a to generate determination set voltages vbp and vbn. The determination voltage generating circuit 104ab is a circuit used in the case of no reference voltage VREF, and the like. As illustrated in FIG. 6, the determination set voltages vbp and vbn generated in the determination voltage generating circuit 104ab are inputted to their corresponding comparators c1a, c2a, cma.

Incidentally, since each of the determination set voltages vbp and vbn may have a difference from other with cells, the accuracy of generating the determination set voltages is not required. For instance, the determination set voltages may include an accidental error.

Configuration b of Variable Comparator

Figure 7:
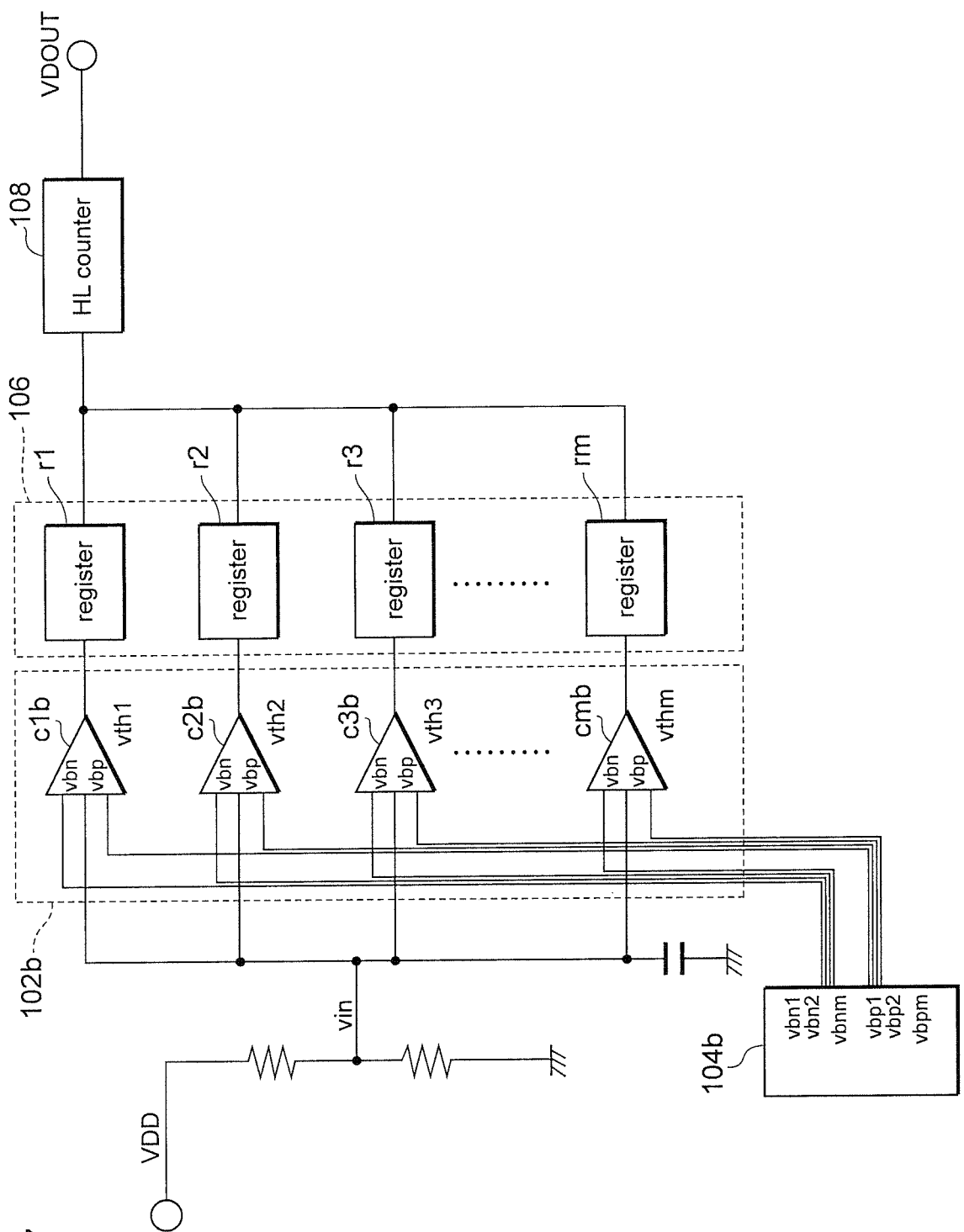
FIG. 7 is a block diagram illustrating one example of a configuration b of a variable comparator in an embodiment.

FIG. 7 is a block diagram illustrating one example of a configuration b of a variable comparator in an embodiment. The variable comparator 102b illustrated in FIG. 7 includes comparators c1b, c2b, . . . , cmb. When the comparators c1b, c2b, . . . , cmb are not described in distinction, a sign cb is used collectively. The comparators respectively have determination thresholds vth1, vth2, vth3, . . . , vthm respectively different from each other.

Each comparator inputs therein determination set voltages vbp and vbn from a determination voltage generating circuit 104b, and a voltage vin obtained by dividing an input voltage, and outputs a signal of an H level or an L level in accordance with its determination threshold.

At this time, a register 106 has registers r1, r2, r3, . . . , rm corresponding to the comparators. Each register stores a second result (H or L) of the corresponding comparator therein. The second result stored in each register is inputted to an HL counter 108.

In the example illustrated in FIG. 7, the transistor sizes of the comparators are the same. Further, the determination set voltages vbp and vbn of the variable comparator 102b are respectively different from each other between the comparators, and the determination thresholds of the comparators are respectively different from each other.

Figure 8:
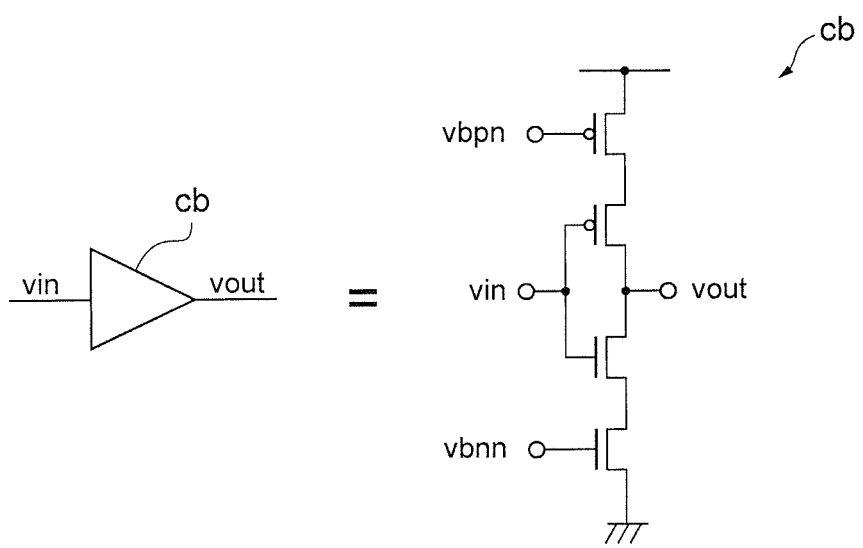
FIG. 8 is a diagram for describing a transistor size of each comparator in the configuration b.

FIG. 8 is a diagram for describing the transistor sizes of each comparator in the configuration illustrated in FIG. 7. FIG. 8 is a diagram illustrating the transistor sizes in each comparator cb. A transistor on the determination set voltage vbpn side and a transistor on the determination set voltage vbnn side are respectively common to the comparators cb. In this example, n is an integer greater than or equal to 1 and less than or equal to m.

Configuration ba of Determination Voltage Generating Circuit

Figure 9:
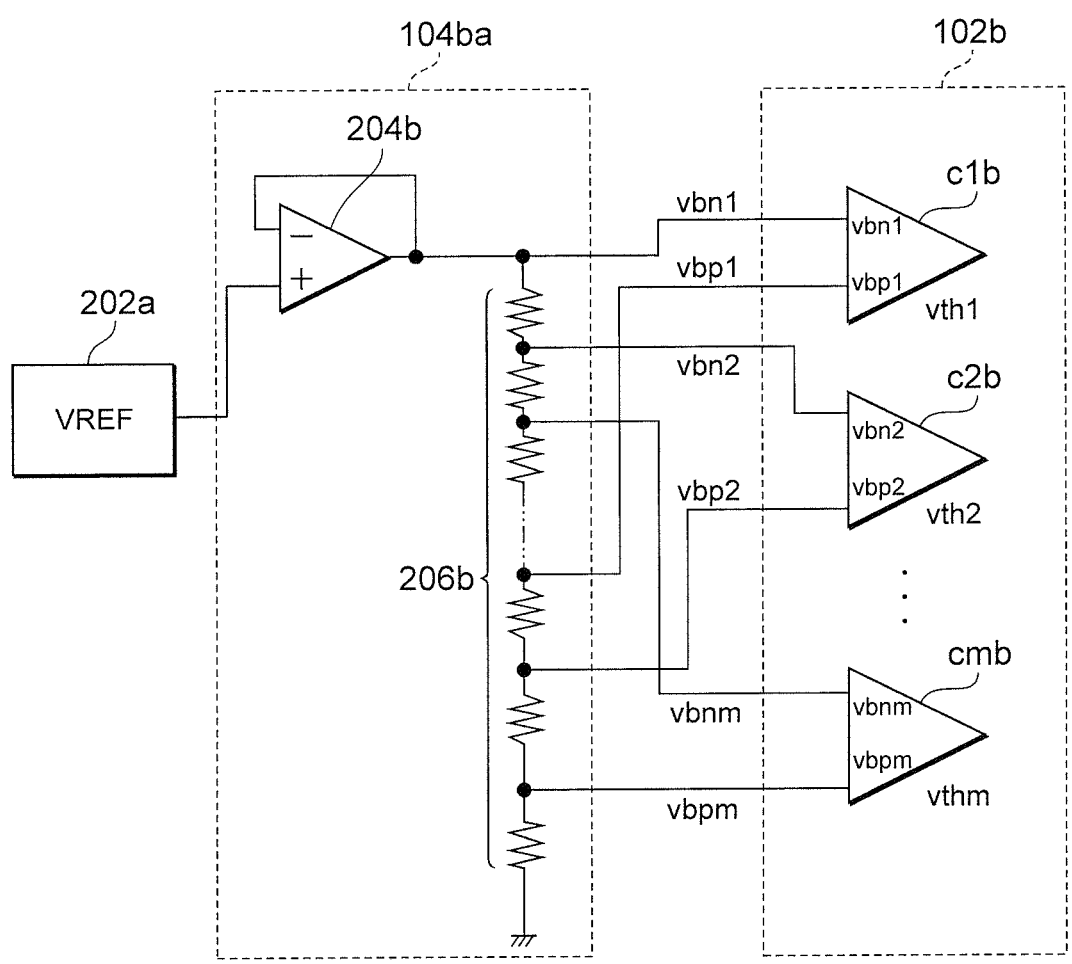
FIG. 9 is a block diagram illustrating one example of a determination voltage generating circuit 104*ba*.

A description will next be made about a configuration example for generating determination set voltages vbp and vbn corresponding to the configuration illustrated in FIG. 7. FIG. 9 is a block diagram illustrating one example of a determination voltage generating circuit 104ba. The determination voltage generating circuit 104ba illustrated in FIG. 9 has a buffer 204b inputted with a reference voltage from a reference power supply source VREF202a provided in the integrated circuit 1, and a resistor group 206b for dividing the reference voltage to generate determination set voltages vbpn and vbnn. As illustrated in FIG. 9, the determination set voltages vbpn and vbnn generated in the determination voltage generating circuit 104ba are inputted to their corresponding comparators c1b, c2b, cmb. For example, the determination set voltages vbp1 and vbn1 are inputted to the comparator c1b, and the determination set voltages vbpm and vbnm are inputted to the comparator cmb.

Configuration bb of Determination Voltage Generating Circuit

Figure 10:
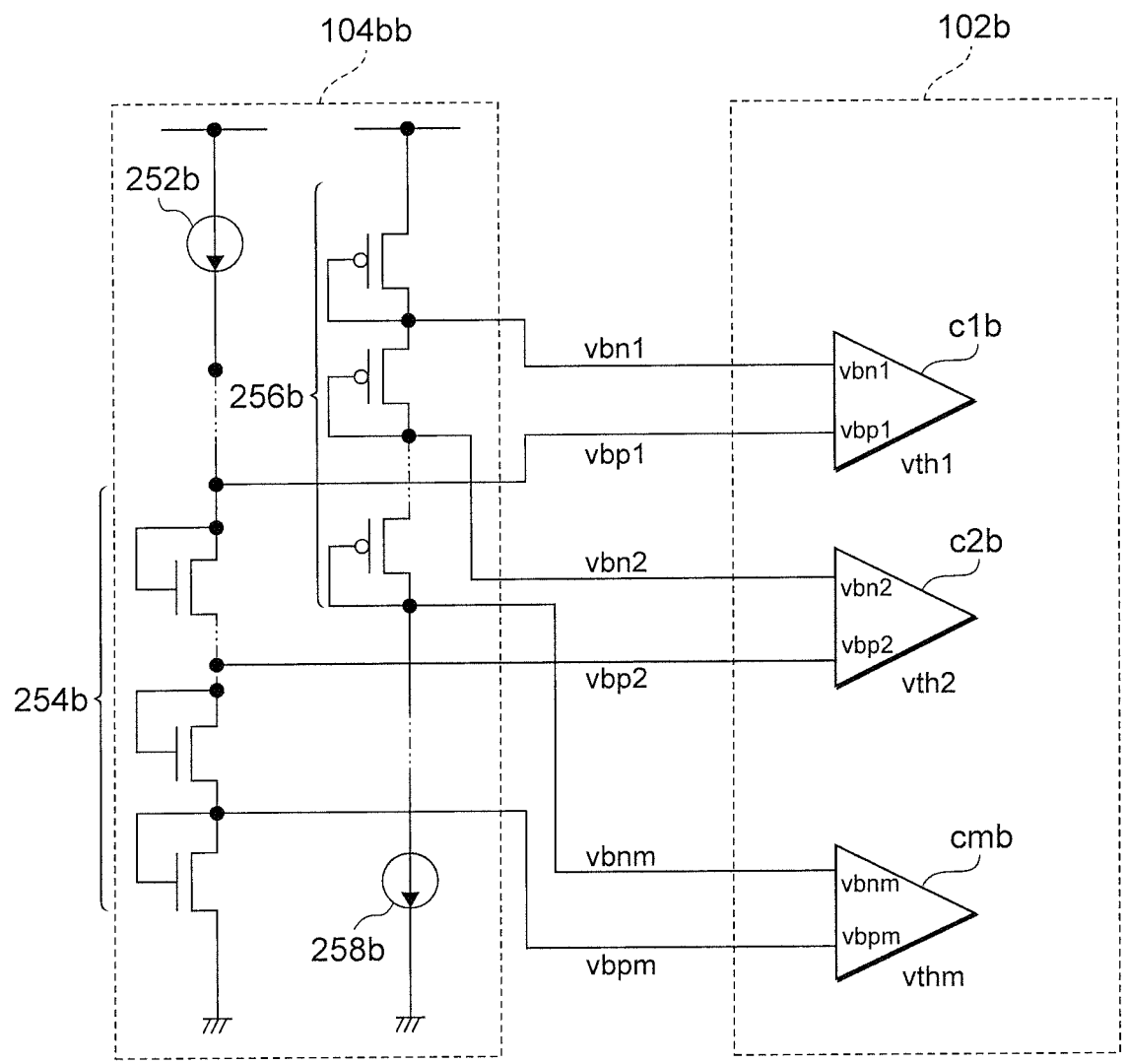
FIG. 10 is a block diagram illustrating one example of a determination voltage generating circuit 104*bb*.

FIG. 10 is a block diagram illustrating one example of a determination voltage generating circuit 104bb. Using a transistor group 254b connected to a constant current source 252b, and a constant current source 258b connected to a transistor group 256b, the determination voltage generating circuit 104bb illustrated in FIG. 10 allows constant currents to flow through the diode-connected transistor groups 254b and 256b to generate determination set voltages vbpn and vbnn. The determination voltage generating circuit 104bb is a circuit used in the case of no reference voltage VREF, and the like. As illustrated in FIG. 10, the determination set voltages vbpn and vbnn generated in the determination voltage generating circuit 104bb are inputted to their corresponding comparators c1b, c2b, cmb. For example, the determination set voltages vbp1 and vbn1 are inputted to the comparator c1b, and the determination set voltages vbpm and vbnm are inputted to the comparator cmb.

Incidentally, since each of the determination set voltages vbpn and vbnn may have a difference from other with cells, the accuracy of generating the determination set voltages is not required. For instance, the determination set voltages may include an accidental error.

Characteristic Example of Variable Comparator

A description will next be made about a characteristic example of the variable comparator 102. For example, the variable comparator 102b is assumed to be used in an example illustrated below.

Figure 11:
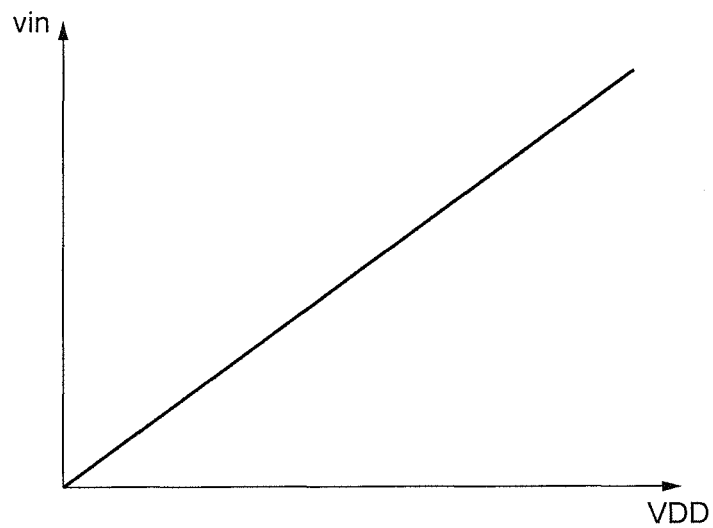
FIG. 11 is a diagram illustrating one example of the relation between an input voltage and a voltage inputted to each comparator included in the variable comparator.

FIG. 11 is a diagram illustrating one example of the relation between an VDD voltage and a voltage vin inputted to each comparator included in the variable comparator 102. As illustrated in FIG. 11, the voltage yin also increases if the input voltage VDD becomes higher.

Figure 12:
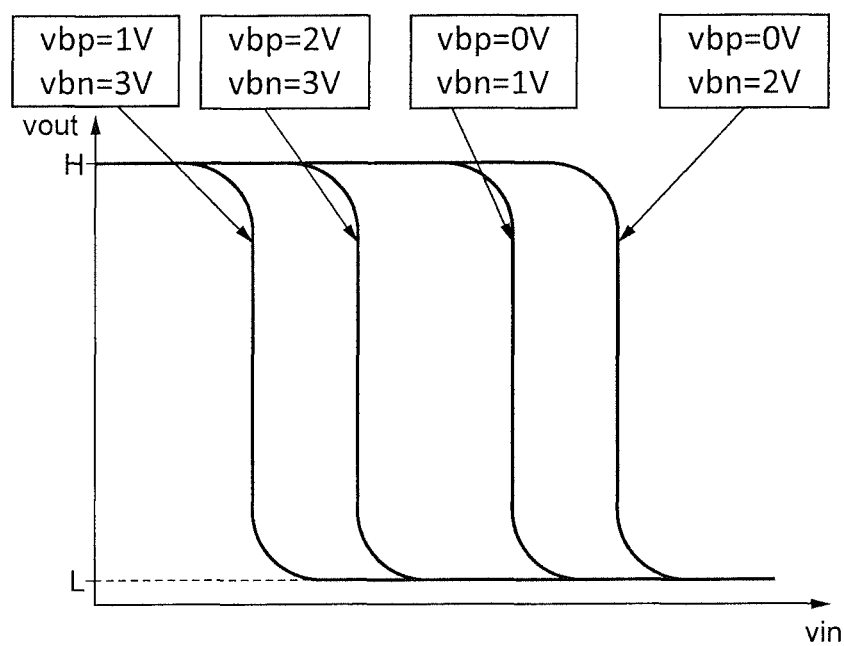
FIG. 12 is a diagram illustrating one example of the relation between an input yin and an output vout of each comparator included in the variable comparator.

FIG. 12 is a diagram illustrating one example of the relation between an input yin and an output vout of each comparator included in the variable comparator 102. As illustrated in FIG. 12, voltages which serve as switching thresholds of whether the output vout becomes a signal of an H level or a signal of an L level differ depending on the values of the determination set voltages vbp and vbn or the difference therebetween.

For example, the voltage yin inputted to each comparator is assumed to be lowered from a high voltage to a low voltage. At this time, in the comparator of the determination set voltages vbp=0V and vbn=2V, the output vout thereof becomes from L to H ahead of other comparators. Next, when the voltage yin becomes low, the output vout of the comparator having the determination set voltages vbp=0V and vbn=1V becomes from L to H.

As described above, as the voltage yin becomes lower, the number of the comparators in each of which the output vout turns to H increases. The HL counter 108 utilizes the number of H outputted from the comparators and determines whether the input voltage is less than or equal to the threshold voltage.

For example, the HL counter 108 stores therein the number (H1) of signals each having an H level to which the output of each comparator at the threshold voltage is brought, counts the number (H2) of signals each having an H level to which the output of each comparator relative to the current input voltage is brought, and determines whether or not H1<H2. If H1<H2, then the HL counter 108 determines that the input voltage is less than or equal to the threshold voltage.

Operation

Figure 13:
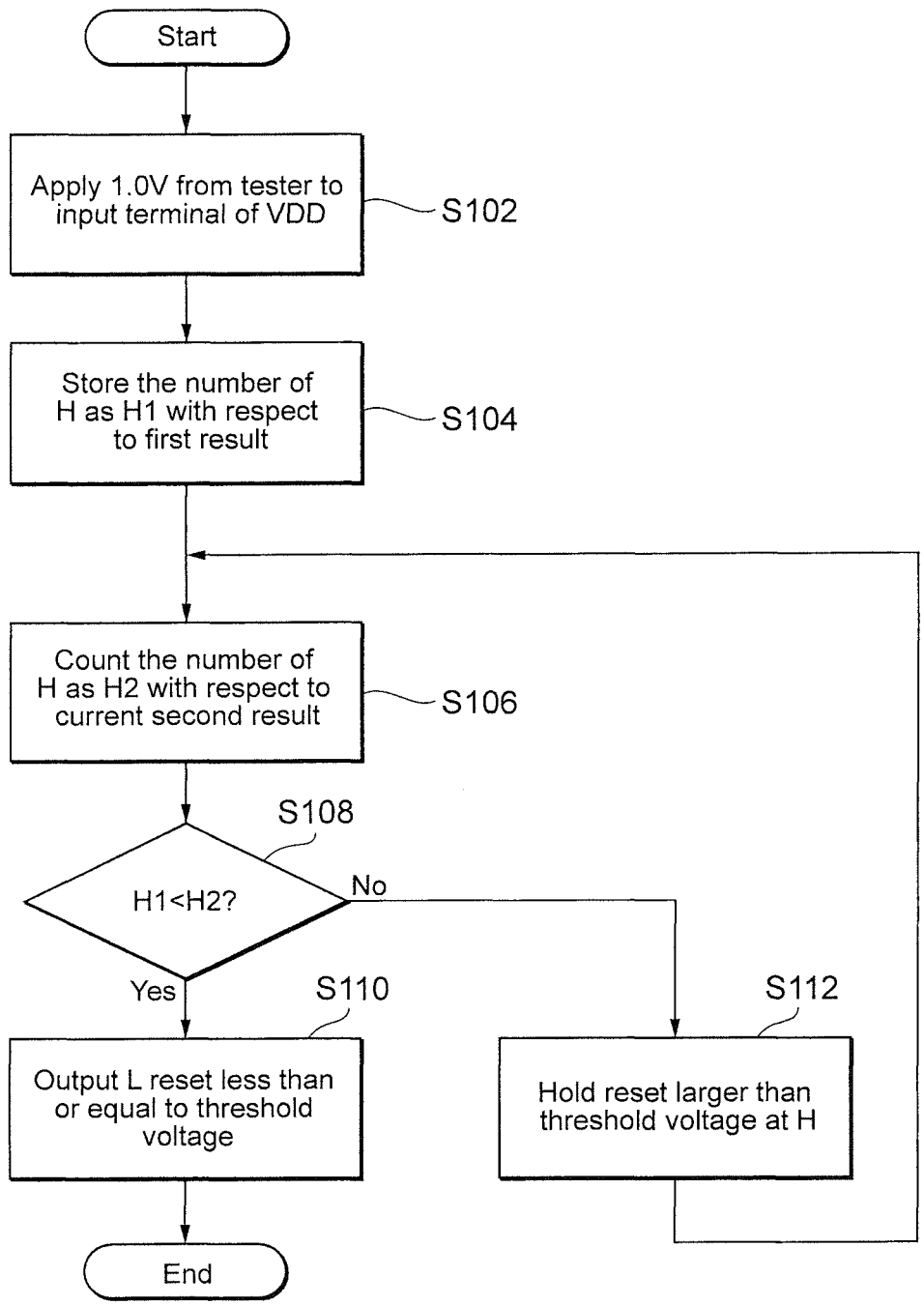
FIG. 13 is a flowchart illustrating one example of the operation of the voltage detector in an embodiment.

A description will next be made about the operation of the voltage detector 10. FIG. 13 is a flowchart illustrating one example of the operation of the voltage detector 10 in an embodiment. In Step 102 illustrated in FIG. 13, 1.0V is applied from the tester to the input terminal of the power supply (VDD). Here, though 1.0V is a threshold voltage, this voltage value is an example and a voltage value desired to be detected may be applied thereto.

In Step S104, the HL counter 108 acquires a first result of each comparator included in the variable comparator 102 and stores therein the number of H levels as H1 with respect to each first result.

These Steps S102 and S104 are preliminary processing for allowing the HL counter 108 to store H1 at the threshold voltage.

In Step S106, the power supply voltage VDD is inputted and a divided voltage yin is inputted to the variable comparator 102. The variable comparator 102 performs comparisons between the voltage yin and determination voltages in the respective comparators and outputs each second result of a signal of an H or L level. The HL counter 108 counts the number of the H levels as H2 with respect to the current each individual second result outputted from the variable comparator 102.

In Step S108, the HL counter 108 determines whether or not H1 is smaller than H2. If H1<H2 (the answer is Yes in Step S108), the HL counter 108 proceeds to Step S110. If H1<H2 is not established (the answer is No in Step S108), the HL counter 108 proceeds to Step S112.

In Step S110, the HL counter 108 determines that the input voltage is less than or equal to the threshold voltage and outputs a signal of an L level, e.g., a reset signal.

In Step S112, the HL counter 108 determines that the input voltage is larger than the threshold voltage and maintains an H signal. That is, a device including the voltage detector 10 is not reset. The above example is an example in which the HL counter 108 is reset when switching from the H level signal to the L level signal is done.

Further, as one example of the state of usage of the voltage detector 10, it is reset as a measure for its malfunction due to a power reduction when the HL counter 108 returns to Step S106 after Step S112 and the input voltage becomes less than or equal to the threshold voltage.

Advantageous Effects

Figure 14:
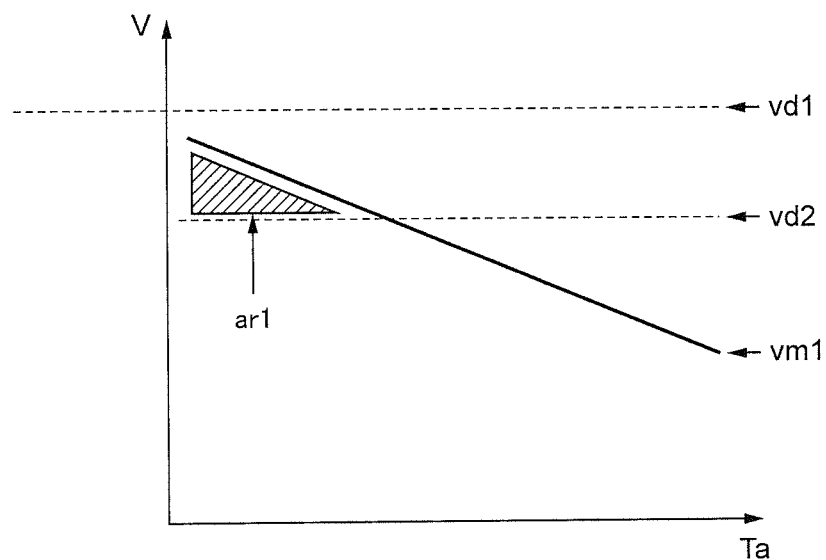
FIG. 14 is a diagram for describing one example of the relation between a threshold voltage and an operation limit voltage in a related art.

A description will next be made about the advantageous effects of the voltage detector 10 in an embodiment. FIG. 14 is a diagram for describing one example of the relation between a threshold voltage and an operation limit voltage in the related art. In the example illustrated in FIG. 14, a threshold voltage Vd1 is set to a voltage higher than an upper limit of an operation limit voltage Vm1. The reset is assumed to occur at less than or equal to the threshold voltage. Here, the threshold voltage Vd1 is constant irrespective of a temperature Ta regardless of the operation limit voltage Vm1 varying due to the temperature Ta.

As illustrated in FIG. 14, when the threshold voltage is lowered than Vd1 and set to be Vd2, the operation voltage is lower than the operation limit voltage Vm1, but an area ar1 whose voltage is higher than the threshold voltage Vd2 is generated. Since the operation voltage is lower than the operation limit voltage Vm1, but not lower than the threshold voltage Vd2 in this area ar1, the device is not reset and hence has the potential for causing a malfunction.

Figure 15:
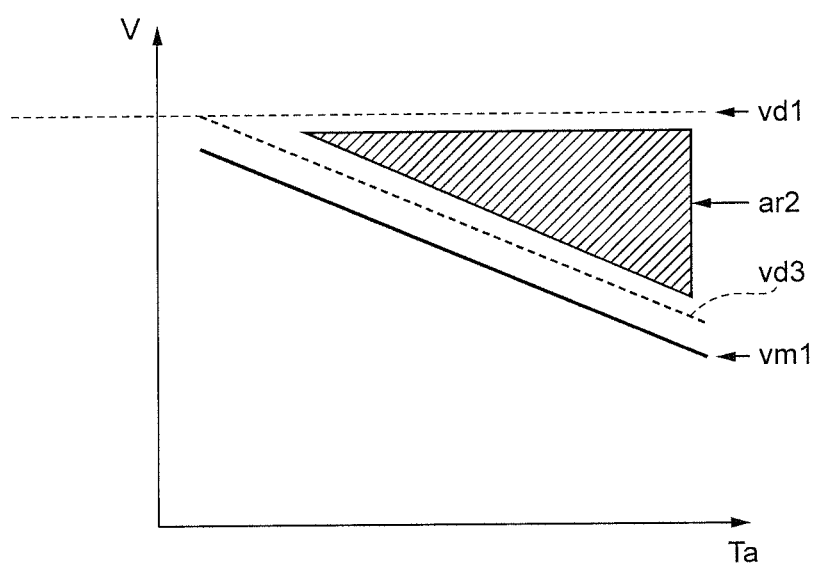
FIG. 15 is a diagram for describing one example of the relation between a threshold voltage and an operation limit voltage of the voltage detector in an embodiment.

FIG. 15 is a diagram for describing one example of the relation between a threshold voltage and an operation limit voltage of the voltage detector 10 in an embodiment. In the example illustrated in FIG. 15, a threshold voltage Vd3 in the voltage detector 10 is variable relative to a conventional threshold voltage Vd1 according to a temperature Ta. Further, since each MOSFET is used in the comparator, its temperature characteristic becomes similar to the operation limit voltage.

An area ar2 illustrated in FIG. 15 is a voltage region which can be used by using the voltage detector 10 although it could not be used in the related art. Thus, the device to which the voltage detector 10 is applied is capable of efficiently using a limited power supply voltage.

Thus, in the voltage detector 10, the temperature characteristic becomes similar to the operation limit voltage since each MOSFET is used in the comparator, and the power supply voltage can be used efficiently since the threshold voltage is variable along the operation limit voltage which changes according to the temperature. Here, the voltage detector 10 may use the comparators each comprised of MOSFETs.

Figure 16:
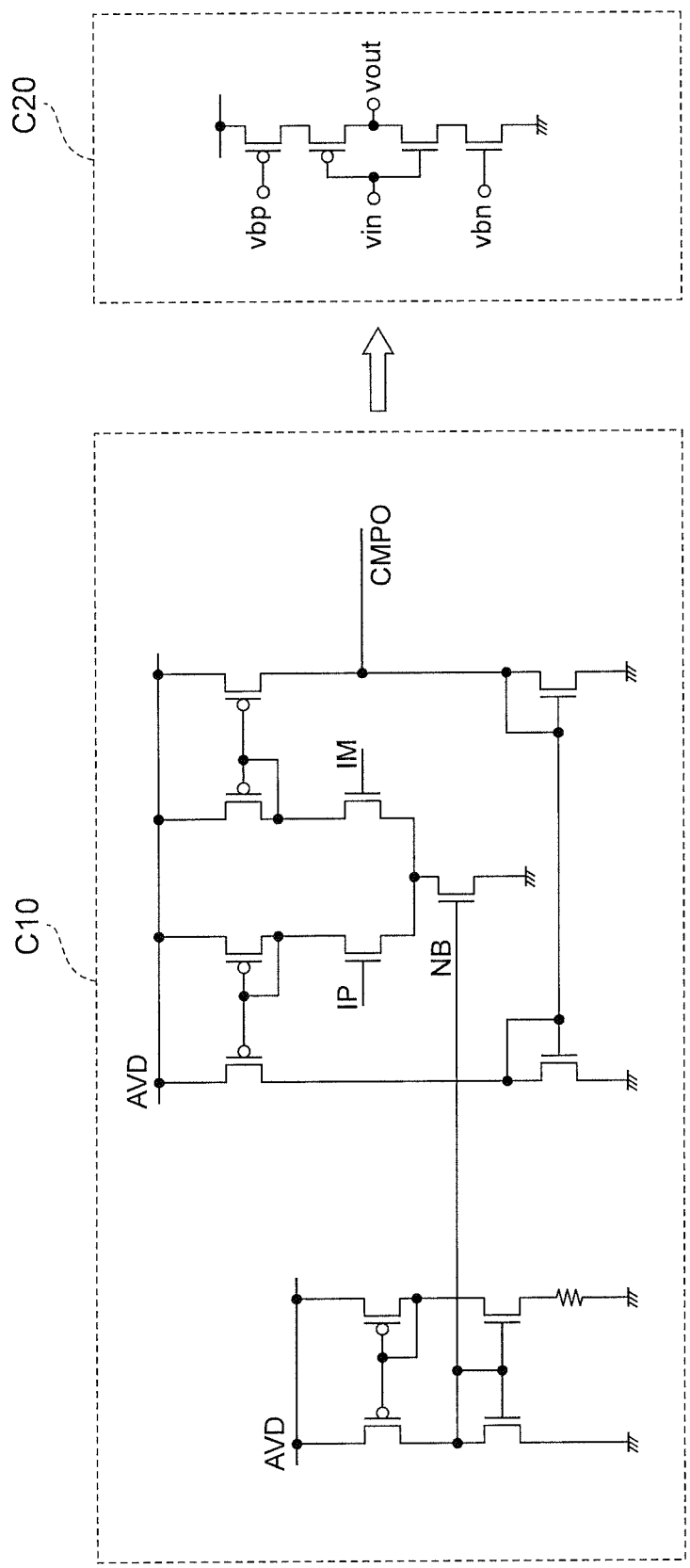
FIG. 16 is a diagram for comparing circuit scales of comparators in the related art and an embodiment.

FIG. 16 is a diagram for comparing the circuit scales of the comparators in the related art and an embodiment. The comparator C10 illustrated in FIG. 16 is based on the comparator in JP2011-198093 cited as the related art. Since the comparator C10 has a configuration which does not depend on the temperature/process, its circuit scale is large.

On the other hand, the comparator C20 illustrated in FIG. 16 is the comparator used in the voltage detector 10 in an embodiment and can be more greatly reduced in circuit scale than the comparator C10. This is because it is not set to the configuration which does not depend on the temperature/process. The comparator C20 is less complex because it is sensitive to temperature, but this inconvenience can be resolved since the threshold voltage is variable along the operation limit voltage which changes according to the temperature.

FIG. 17 is a diagram for describing the ratio between the areas of the voltage detectors in the related art and the one embodiment. The relative accuracy has been taken into consideration in the example illustrated in FIG. 17. It is necessary to make an element size in an analog circuit larger than an element size of a logic circuit. Circuit A is designed in such a manner as to be capable of detecting a fixed voltage with an accuracy of ±50 mV in the whole region of the semiconductor process variation and temperature, using the related art. Circuit B has the configuration of the voltage detector 10 and is designed so as to be capable of detecting a voltage with an accuracy of ±50 mV by arranging 10 comparators of 10 mV steps in parallel.

In terms of a layout area illustrated in FIG. 17, the circuit A has 21250 um$^2$, whereas the circuit B has 2370 um$^2$. Because circuit B can be consisted of small-sized elements compared with circuit A, the circuit B can be more greatly reduced in area than the circuit A.

Incidentally, although the count of the number of H varies depending on the temperature and process, there is no need to fix the voltage targeted for detection in the whole region of the process and temperature because each comparator configured using MOSFETs is used.

Figure 18:
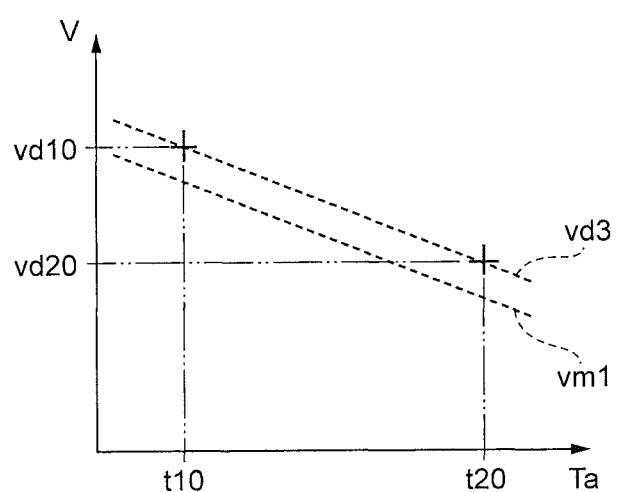
FIG. 18 is a diagram for describing a change in the threshold voltage in an embodiment.

FIG. 18 is a diagram for describing a change in the threshold voltage in an embodiment. As illustrated in FIG. 18, the operation limit voltage Vm1 of the user logic unit and the threshold voltage of the variable comparator 102 respectively have a similar temperature characteristic. Thus, the threshold voltage of the variable comparator 102 may be set to be higher than the operation limit voltage of the user logic unit at a certain temperature.

As illustrated in FIG. 18, the threshold voltage of the variable comparator 102 is Vd20 at a temperature t20. At a temperature t10 (<t20), the threshold voltage of the variable comparator 102 is Vd10 (>Vd20).

As illustrated in FIG. 18, even though the temperature changes and thereby the threshold voltage changes, its change is one in which a change in the temperature characteristic of the threshold of each MOSFET has appeared. Thus, the HL counter 108 is capable of generating an essentially required reset signal having considered a change in transistor characteristics by comparing a count value (H1) of H based on a first result trimmed by a previous test and a count value (H2) of H based on a second result of an input voltage.

As described above, according to the voltage detector 10 in an embodiment, it is possible to reduce the circuit scale and make the detectable voltage value variable. For example, according to the voltage detector 10, since it is not necessary to configure the circuit independent on the process and temperature, the circuit scale can be greatly reduced as compared with the related art circuit. Also according to the voltage detector 10, the voltage corresponding to the transistor characteristics can be detected by configuring each comparator included in the variable comparator 102 using MOSFETs, and the voltage region not used in the related art circuit can hence be used. Further, the voltage detector 10 needs not to take into consideration an offset of each comparator. Furthermore, the voltage detector 10 is capable of increasing the number of the comparators included in the variable comparator 102 and thereby improving the accuracy of the voltage for detecting the reset. Still further, since the voltage detector 10 is small in macro area, it can be arranged in plural form as in the standard cell. For each block in a chip, the voltage detector 10 is capable of detecting different voltage levels with high accuracy.

Although the above one embodiment has described the example in which the low voltage less than or equal to the threshold voltage is detected where the power supply voltage is lowered, it is also possible to detect a high voltage greater than or equal to the threshold voltage where the power supply voltage is raised. In this case, since the number of H levels of respective second results decreases with the increase in the power supply voltage, the high voltage is detected when H2 becomes less than or equal to H1.

CONCLUSION

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A voltage detector, comprising:
   a comparison unit having a plurality of comparators, said comparison unit configured to compare a threshold voltage received via a voltage divider and determination voltages corresponding to said each comparator, and output a first result of High or Low for each comparator based on the comparison of the threshold voltage and the determination voltages, the comparison unit being further configured to compare an input voltage received via the voltage divider and the determination voltages, and output a second result of High or Low for each comparator based on the comparison of the input voltage and the determination voltages; and
   a determination unit comprising a counter configured to determine whether or not the input voltage is less than or equal to the threshold voltage, the determination being based on a count of High levels output by each of the plurality of comparators for the threshold voltage, and based on a count of High levels output by each of the plurality of comparators for the input voltage.

2. The voltage detector according to claim 1, further including a register configured to store therein the second result outputted from the comparison unit,
   wherein the determination unit is configured to perform determination, based on the first result and the second result stored in the register.

3. The voltage detector according to claim 1, wherein the determination voltages are common to the respective comparators, and
   wherein determination thresholds for output switching are respectively different from each other in each of the comparators.

4. The voltage detector according to claim 1,
   wherein the determination voltages are different from each other in each of the comparators, and
   wherein determination thresholds for output switching are respectively different from each other in each of the comparators.

5. The voltage detector according to claim 1, wherein each of the plurality of comparators includes one or more field effect transistors.

6. The voltage detector according to claim 5, wherein the sizes of the one or more field effect transistors are different between different ones of the comparators.

7. The voltage detector according to claim 5, wherein the sizes of the one or more field effect transistors are the same between different ones of the comparators.

8. A method for detecting a voltage, comprising the steps of:
   comparing, using a plurality of comparators within a comparison unit, a threshold voltage received via a voltage divider and determination voltages corresponding to each of the comparators and outputting a first result of High or Low for each comparator;
   comparing, using the comparison unit, an input voltage received via the voltage divider and the determination voltages and outputting a second result of High or Low for each comparator; and
   determining, using at least a counter of a determination unit, whether or not the input voltage is less than or equal to the threshold voltage, the determining being based on a count of High levels output by each of the plurality of comparators for the threshold voltage, and based on a count of High levels output by each of the plurality of comparators for the input voltage.

* * * * *